(12) United States Patent
Takata et al.

(10) Patent No.: US 6,988,886 B2
(45) Date of Patent: Jan. 24, 2006

(54) THERMAL TREATMENT SYSTEM FOR SEMICONDUCTORS

(75) Inventors: Masaaki Takata, Takasago (JP); Nobuo Kageyama, Takasago (JP); Susumu Otaguro, Yokohama (JP); Jiro Nishihama, Aiko-gun (JP)

(73) Assignee: Asahi Glass Company, Limited, Tokyo (JP)

(*) Notice: Subject to any disclaimer, the term of this patent is extended or adjusted under 35 U.S.C. 154(b) by 0 days.

(21) Appl. No.: 10/809,705

(22) Filed: Mar. 26, 2004

(65) Prior Publication Data

US 2005/0053890 A1 Mar. 10, 2005

(30) Foreign Application Priority Data

Mar. 28, 2003 (JP) .............................. 2003-090050

(51) Int. Cl.
*F27D 1/18* (2006.01)
(52) U.S. Cl. ..................... 432/242; 432/247; 118/725
(58) Field of Classification Search ................ 432/52, 432/241, 242, 247, 250; 118/724, 725, 733; 219/209, 390
See application file for complete search history.

(56) References Cited

U.S. PATENT DOCUMENTS

| 5,207,573 | A | * | 5/1993 | Miyagi et al. .............. 432/182 |
| 5,368,648 | A | | 11/1994 | Sekizuka |
| 5,578,132 | A | * | 11/1996 | Yamaga et al. ............. 118/724 |
| 5,902,406 | A | * | 5/1999 | Uchiyama et al. .......... 118/724 |
| 6,709,525 | B2 | * | 3/2004 | Song .......................... 118/733 |
| 6,746,240 | B2 | * | 6/2004 | De Ridder et al. ......... 432/241 |
| 2003/0010291 | A1 | | 1/2003 | Song |

FOREIGN PATENT DOCUMENTS

EP    0 795 897    9/1997

* cited by examiner

*Primary Examiner*—Gregory Wilson
(74) *Attorney, Agent, or Firm*—Oblon, Spivak, McClelland, Maier & Neustadt, P.C.

(57) ABSTRACT

A thermal treatment system for semiconductors comprises an outer tube made of silicon carbide, a base hermetically supporting a lower portion of the outer tube, a lid selectively opening and closing an opening formed in a central portion of the base, and a reactor wall surrounding an outer peripheral wall and the like of the outer tube and having a heater provided on an inner side, wherein an annular sealing member and an annular supporting member are interposed between the outer tube and the base, and wherein the supporting member has an effective heat transfer coefficient of 50 to 2,000 W/(m$^2$·K).

4 Claims, 4 Drawing Sheets

Vertical Movement

92

92

92

THERMAL TREATMENT SYSTEM FOR SEMICONDUCTORS

BACKGROUND OF THE INVENTION

1. Field of the Invention

The present invention relates to a thermal treatment system for semiconductors, which is used for depositing a non-oxide film, such as a polysilicon film or a nitride film, or an oxide film on a surface of a semiconductor wafer.

2. Description of the Related Art

For the outer tube or the inner tube used in low pressure CVD systems for thermal treatment of semiconductors and reactors for high-temperature thermal treatment, quartz glass has been used, for example, for reasons that it is easy to obtain high-purity glass, it has a thermal resistance, it has a small thermal stress generated due to a low thermal expansion coefficient, and it is excellent at thermal insulation due to a low thermal conductivity. When a deposited film is a polysilicon film or a nitride film, a thermal treatment system for semiconductors, which uses, e.g., an outer tube made of silicon carbide, has been recently proposed from the viewpoints that the difference in thermal expansion coefficient between the deposited film and quartz glass causes the deposited film on the quartz glass to peel off in the system and contaminate a wafer and that the thermal resistance is further improved (see Patent Documents 1 and 2).

However, the use of silicon carbide has a problem that fracture is easily caused due to tensile stresses or bending stresses mainly generated at three locations A, B and C shown in FIG. 7 of Patent Document 2 (corresponding to FIG. 4 of the application) since silicon-carbide has a higher thermal expansion coefficient and a higher thermal conductivity than quartz glass. The use of silicon carbide also has a problem that an O-ring, which is normally interposed between the outer tube and a base, is apt to be seized because of silicon carbide having a high thermal conductivity, and the gas-sealing ability is therefore impaired easily.

As one of the measures, it has been proposed a method (hereinbelow, referred to as measure A) wherein the distance between the bottom surface of an outer tube made of silicon carbide and the lowest end of a heater is set at a length of 200 mm or longer in order to locate an O-ring physically away from a heat source (see Patent Document 1). As another measure, it has been proposed a method (hereinbelow, referred to as measure B) wherein a seal ring is interposed between a flange of an outer tube made of silicon carbide and a base and wherein an inner peripheral portion of the flange that is radially more inward than the seal ring is contacted to and supported by the base (see Patent Document 2).

However, it has been recently difficult to ensure a length of 200 mm or longer. This is because it is strongly demanded to deal with a large volume of silicon wafers at a time and because there is a tendency to spread an isothermal heating zone or to bring the lower end of a heater as near to a base as possible in order to increase the number of silicon wafers to be dealt with in a thermal treatment system for semiconductors, such as a low pressure CVD system. From this viewpoint, measures other than measure A have been demanded more and more.

Additionally, the diameter of silicon wafers has been further increased from 200 mm to 300 mm or longer, and the outer diameter of outer tubes has been accordingly increased to 350 mm or longer. For this reason, in the case of adopting measure B, there is a possibility that the flange of an outer tube is insufficiently cooled. There is also a possibility that the load pressure applied to a sealing member varies according to temperature to cause gas leakage due to an insufficient sealing pressure in particular at a time of carrying out treatment at a low temperature since an inner peripheral portion of the flange supported by the base has line contact and since the contact location changes according to a thermal treatment temperature.

In other words, there have been proposed no measures other than measure A or measure B, which can satisfy the requirements, such as an increase in diameter, an increase in, throughput, and prevention of contamination caused by particles, which can minimize the limitations in the shape and the way of use of an outer tube or the like to be used, and which can make it difficult for the outer tube or the like to be fractured by a thermal stress, have sufficient durability and be excellent at sealing ability without supporting the outer tube or the like at an inner peripheral portion.

Patent Document 1
JP-A-9-251991 (page 1 to page 7 and FIG. 1)
Patent Document 2
JP-A-10-195657 (page 1 to page 8 and FIGS. 1 to 7, in particular FIG. 7)

Patent Documents 1 and 2 correspond to U.S. Pat. No. 5,902,406 and EP-A-0795897.

SUMMARY OF THE INVENTION

It is an object of the present invention to provide a thermal treatment system for semiconductors, which is capable of coping with requirements, such as an increase in diameter, an increase in throughput and prevention of contamination caused by particles, minimizing the limitation to the shape and the way of use of an outer tube and the like to be used, and providing the outer tube with sufficient durability and excellent sealing ability without providing a projection to an inner peripheral portion of a base for supporting the outer tube and the like.

The present invention provides a thermal treatment system for semiconductors, comprising an outer tube, which is made of silicon carbide, and which has an upper portion closed and a lower portion opened, and has a flange formed on an outer peripheral side of the lower portion; a base, which supports the lower portion of the outer tube and provides hermetic seal between the lower portion of the outer tube and the base; a lid, which is provided so as to selectively open and close an opening formed in a central portion of the base; and a reactor wall, which surrounds an outer peripheral wall and an upper wall of the outer tube and has a heater provided on an inner side; wherein an annular sealing member and an annular supporting member are interposed between the outer tube and the base so that the supporting member is located around an outer peripheral side of the sealing member, and wherein the supporting member has an effective heat transfer coefficient of 50 to 2,000 W/(m$^2$·K).

The thermal treatment system for semiconductors according to the present invention (hereinbelow, referred as the system) is a thermal treatment system for semiconductors, which comprises an outer tube, which is made of silicon carbide, and which has an upper portion closed and a lower portion opened, and has a flange formed on an outer peripheral side of the lower portion; a base, which supports the lower portion of the outer tube and provides hermetic seal between the lower portion of the outer tube and the base; a lid, which is provided so as to selectively open and close an opening formed in a central portion of the base; and a reactor wall, which surrounds an outer peripheral wall and an upper wall of the outer tube and has a heater provided on an inner side. When the system is used as a low pressure CVD system, it is preferable that an inner tube, which has upper and lower ends opened, and which is made of silicon carbide, is put on the base so as to be provided around an inner peripheral side of the outer tube with a gap.

In order to provide a thermal treatment system for semiconductors capable of reducing a thermal stress generated in the outer tube, making it difficult for the outer tube to be fractured and being excellent at sealing ability without adopting measure A or measure B stated earlier, the system according to the present invention is characterized in that the heat conduction from the flange of the outer tube to the base is controlled by entrusting the annular ring typically represented by an O-ring to ensure the sealing ability, by providing the annular supporting member around the outer peripheral side of the annular sealing member to reduce the thermal stress generated in the outer tube and appropriately lower the temperature of the annular sealing member, and by providing the supporting member with an effective heat transfer coefficient of 50 to 2,000 W/(m$^2$·K).

BRIEF DESCRIPTION OF THE DRAWINGS

In drawings.

DETAILED DESCRIPTION OF THE INVENTION

Figure 1:
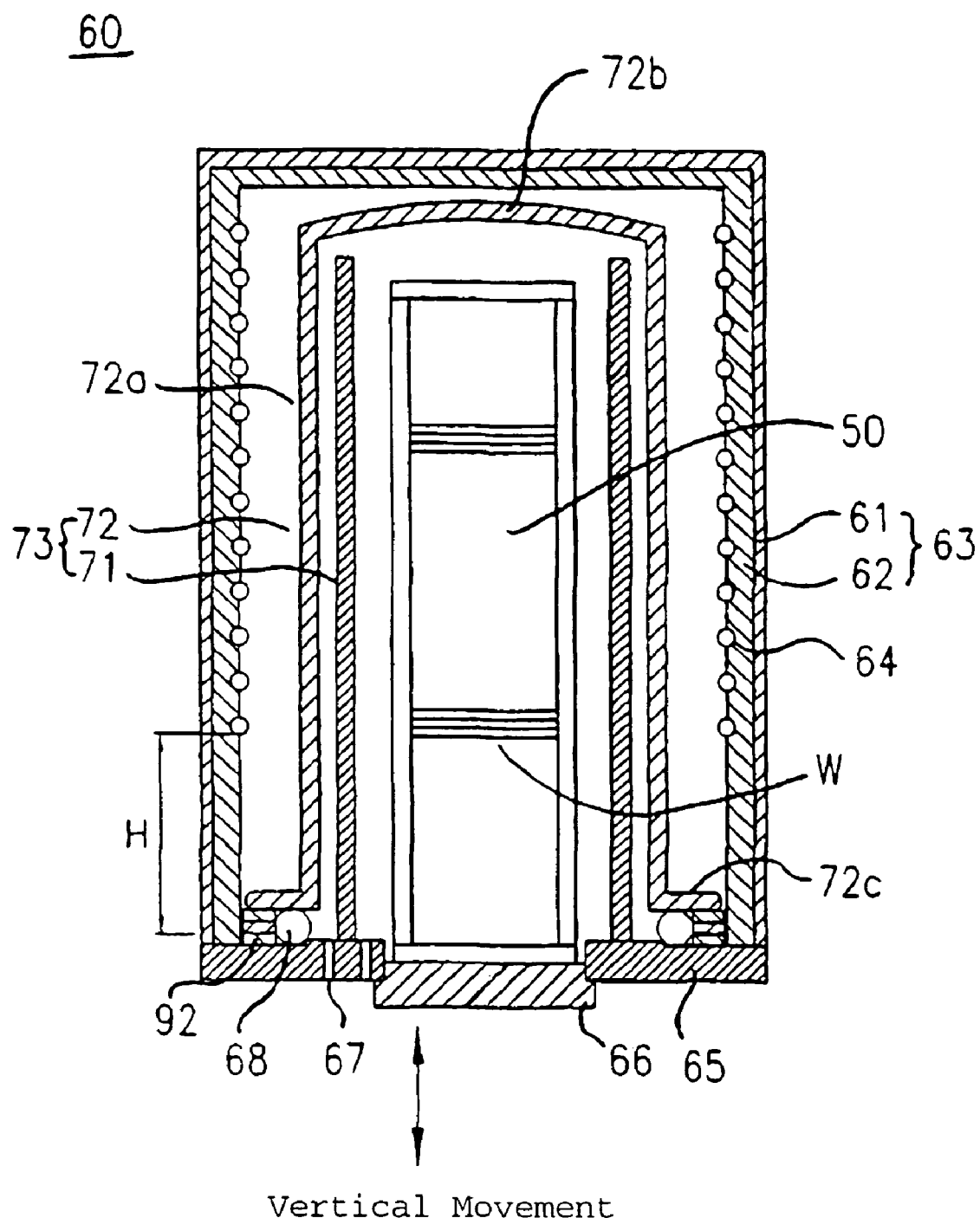
FIG. 1 is a vertical cross-sectional view of an embodiment of the low pressure CVD system according to the present invention.

Now, the system according to an embodiment of the present invention will be described in detail, referring to the accompanying drawings. FIG. 1 shows a vertical cross-sectional view of a typical case wherein the system 60 is applied to a low pressure CVD system including an outer tube 72 and an inner tube 71. The system 60 includes a reactor wall 63 comprising a metal casing 61 and a thermal insulation material 62 affixed to an inner peripheral side thereof. The reactor wall 63 has an inner peripheral side provided with a heater 64. The reactor wall 63 has a lower side closed by a base 65. The base 65 has a central portion formed with an opening for introduction and withdrawal of semiconductor wafers W, and the opening is provided with a lid 66, which can selectively open and close the opening by being vertically moved by an unshown lift. The base 65 has a gas introduction and discharge port 67.

The base 65 has a dual tube 73 put thereon, the dual tube comprising the inner tube 71 and the outer tube 72 surrounding an outer periphery side of the inner tube 71 with a gap, the inner tube having upper and lower ends opened and being made of silicon carbide, and the outer tube also being made of silicon carbide. Although the inner tube 71 may be eliminated from the system, the inner tube is normally provided when the system is applied to a low pressure CVD system. The outer tube 72 comprises a peripheral wall 72a in a cylindrical shape, an upper wall 72b closing an upper end of the peripheral wall 72a, and a flange 72c provided on the outer peripheral side of the lower edge of the peripheral wall 72a.

The base 65 has an annular recess or step formed at a portion to be in contact with a bottom surface of the flange 72c. The recess or step has an annular sealing member 68 housed therein to hermetically seal the bottom surface of the flange 72c. The base 65 has an unshown water jacket formed therein to prevent the annular sealing member 68 from being heat-damaged. The recess or step has an annular supporting member 92 housed therein so as to be provided around an outer peripheral side of the annular sealing member 68.

In the system, the supporting member 92 has an effective heat transfer coefficient (overall heat transfer coefficient) of 50 to 2,000 W/(m$^2$·K). The effective heat transfer coefficient is given by dividing heat quantity passing from the flange 72c of the outer tube to the base 65 through the supporting member per unit time by the area of the supporting member. The area of the supporting member 92 means the projected area of the supporting member that is obtained by projecting the supporting member in use from above.

When the effective heat transfer coefficient is less than 50 W/(m$^2$·K), there is a possibility that the sealing member 68, such as an O-ring, is subjected to heat damage, such as seizure, since the flange is insufficiently cooled. On the other hand, when the effective heat transfer coefficient is beyond 2,000 W/(m$^2$·K), there is a possibility that the flange is apt to be fractured since the temperature difference between the inner and outer peripheral sides of the flange is too great. The effective heat transfer coefficient is preferably not higher than 1,000 W/(m$^2$·K). In order to apply the system to a process for fabricating semiconductors at a relatively high temperature, the effective heat transfer coefficient is preferably 100 to 600 W/(m$^2$·K), more preferably 200 to 500 W/(m$^2$·K).

Figure 2:
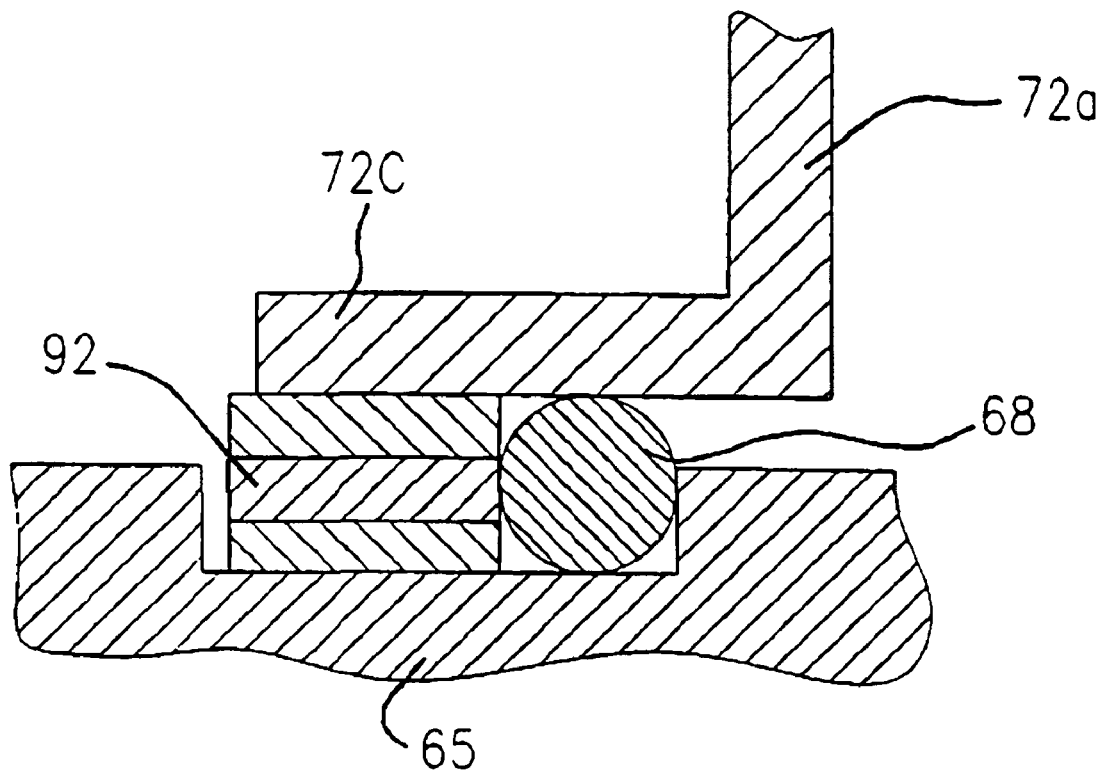
FIG. 2 is an enlarged fragmentary view of a supporting member and its surroundings in the embodiment.

There is no limitation to the structure of the supporting member as long as the supporting member has an effective heat transfer coefficient in such a range. The supporting member is not always a single member. The supporting member may have a layered structure wherein identical kinds of materials, similar kinds of material or different kinds of materials are layered. FIG. 2 shows an enlarged fragmentary view of the supporting member 92 and its surroundings in the system. In this figure, reference numeral 92 designates the annular supporting member provided around the outer peripheral side of the annular sealing member 68. Although the sealing member 68 and the supporting member 92 are both annular, each of the sealing member and the supporting member is not always a ring as a single member. Each of the sealing member and the supporting member may be formed by combining divided sections into a ring shape.

Figure 3A:
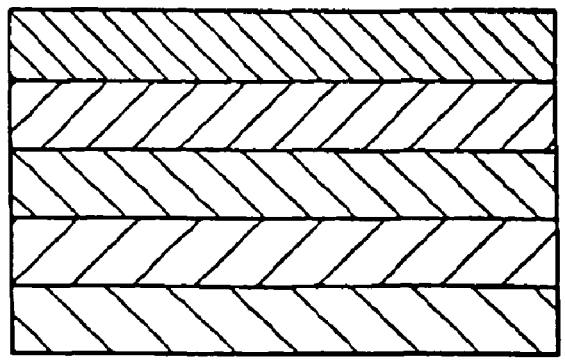
FIGS. 3(a), 3(b) and 3(c) are schematic views of typical examples of the supporting member, wherein the supporting member comprises plural members layered in a height direction in FIG. 3(a), the supporting member comprises plural members concentrically layered in a peripheral direction in FIG. 3(b), and the supporting member comprises plural members layered in a height direction and a surface in contact with a flange tapered in FIG. 3(c)
Figure 3B:
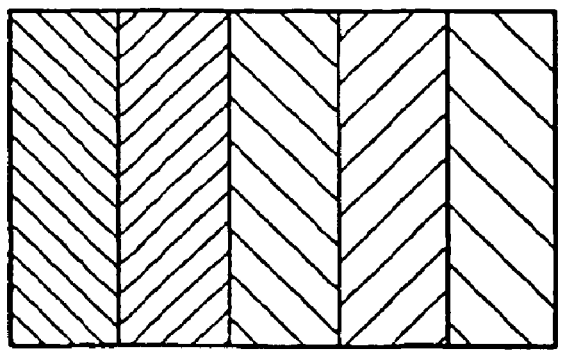
Figure 3C:
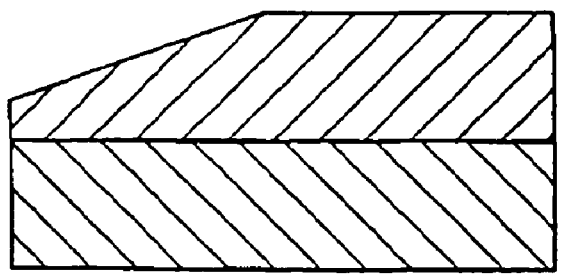
Figure 4:
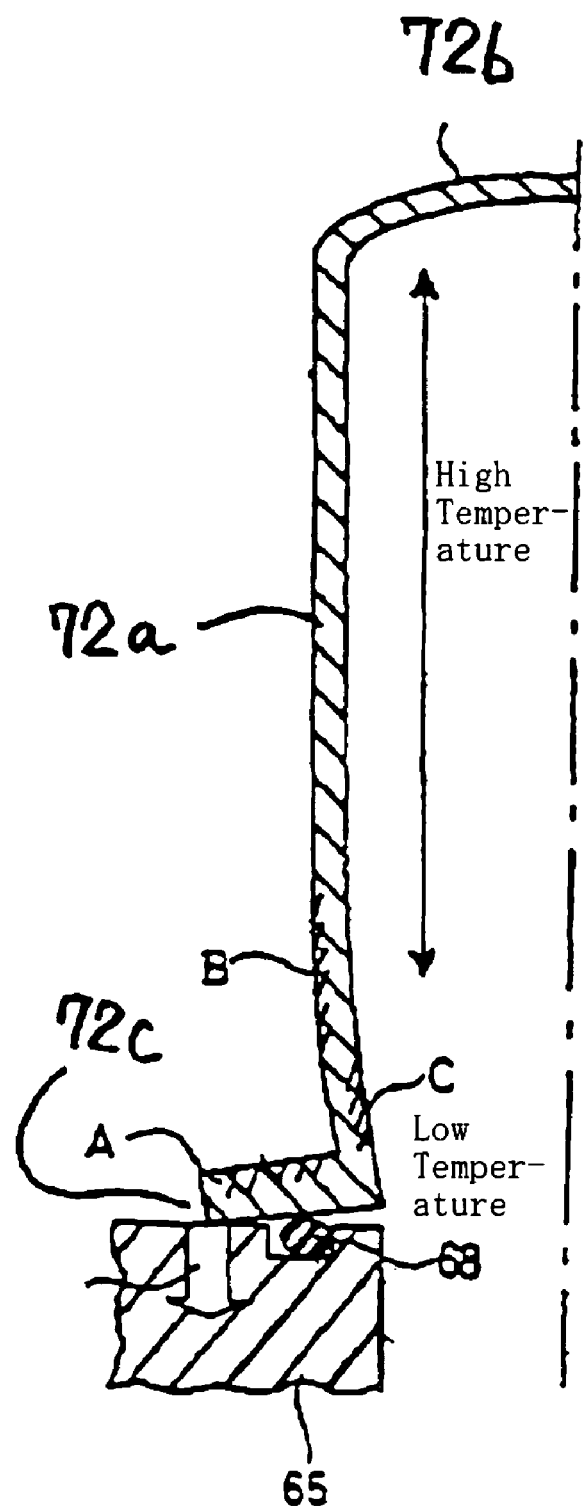
FIG. 4 is a schematic view explaining how an outer tube is deformed when being used at a high temperature.

FIGS. 3(a) to 3(c) show typical examples of the supporting member 92. FIG. 3(a) shows a case wherein the supporting member 92 is formed by layering plural members in a height direction. FIG. 3(b) shows a case wherein the supporting member 92 is formed by concentrically layering plural members in a peripheral direction as in a tree-ring. FIG. 3(c) shows a case wherein the supporting member 92 is formed by layering plural members in a height direction and then tapering a surface of the layered structure in contact with the flange 72c of the outer tube. Layering may be done in both of a height direction and a peripheral direction. In the case of layering in a height direction, the members to layer do not always have the same shape unlike the case in FIG. 3(a). For example, the members to layer may be formed so as to have gradually larger areas from bottom to top, or only the bottom member has a larger area.

When layering is done in a height direction as shown in FIG. 3(a), the layering may be done by using identical kinds of materials or different kinds of materials. This is because it is possible to control the effective heat transfer coefficient not only in the case of combining different kinds of materials but also in the case of layering identical kinds of materials. However, when layering is concentrically done as shown in FIG. 3(b), it is difficult in practice to layer identical kinds of material to control the effective heat transfer coefficient since the heat transfer direction is directed to a vertical direction. From this viewpoint, it is preferable to concentrically layer different kinds of materials, and it is more preferable to concentrically layer different kinds of materials so as to alternately include a first kind of materials and a second kind of materials in the layered structure.

From the viewpoint of preventing the outer tube from being fractured, it is preferable that the supporting member has a surface in contact with the outer tube flange 72c formed with a tapered structure or a stepped structure, as needed, to cope with thermal deformation in use (see FIG. 3(c)). When the surface in contact with the outer tube flange 72c is formed with the tapered structure, the entire surface in contact with the outer tube flange 72c may be tapered, or a portion of the surface in contact with the outer tube flange may be formed with a tapered structure. When the surface is formed with the stepped structure, the number of steps in the stepped structure (the number may be one), the height of a step, the width of a step or the like may be appropriately determined.

It is preferable that the supporting member 92 has an elastic modulus of 0.2 to 120 GPa. The reason why it is preferable that the supporting member 92 has an elastic modulus in such a range is that the outer tube 72 can be prevented from being fractured since the supporting member 92 can be deformed so as to cope with thermal deformation of the outer tube flange. When the elastic modulus of the supporting member 92 is beyond 120 GPa, the supporting member 92 is difficult to be deformed so as to follow the thermal deformation of the outer tube 72 since the difference between the elastic modulus of the outer tube made of silicon carbide (about 350 GPa) and the elastic modulus of stainless steel usually used for the base (about 200 GPa) is relatively smaller. On the other hand, when the elastic modulus of the supporting member 92 is less than 0.2 GPa, there is a possibility that the sealing member, such as an O-ring, is apt to be crushed by a load.

The outer tube flange is more deformed by thermal deformation as the outer tube flange is used at a higher temperature. From the viewpoint of coping with this problem, the elastic modulus of the supporting member 92 is preferably not greater than 100 GPa, more preferably not greater than 80 GPa. In particular, it is preferable that the elastic modulus of the supporting member 92 is not greater than 50 GPa. On the other hand, from the viewpoint that the sealing member, such as an O-ring, can be prevented from being crushed in order to improve durability, the elastic modulus of the supporting member 92 is preferably not less than 0.5 GPa, more preferably not less than 1 GPa.

Specific examples of the material of the supporting member 92 having the properties stated earlier are fluororesins, such as polytetrafluoroethylene (PTFE), a copolymer comprising tetrafluoroethylene and hexafluoropropylene (FEP), a copolymer comprising tetrafluoroethylene and perfluoroalkoxyethylene (PFA), and a copolymer comprising tetrafluoroethylene and ethylene (ETFE). In order to control the elastic modulus and the thermal properties, the supporting member may be made of a composite material with glass fiber or have a porous structure.

Examples of the material of the supporting member other than such heat-resistant resins are solo use of or use in a combination with nonferrous metal, such as aluminum (Al), silicon (Si), and an aluminum-silicon alloy typically represented by silumin (38% of Al and 12% of Si). Examples of the sealing member 68, which is interposed between the outer tube 72 and the base 65 along with the supporting member 69, are an O-ring made of heat-resistant fluorocarbon rubber for, e.g., a low pressure CVD system, and a gasket made of Al for higher temperature application.

Although the outer tube 72 to be used in the system 60 may be made of any kinds of silicon carbide for treatment of semiconductors, it is preferable that the outer tube has such a high purity that the contents of impurities typically represented by iron are not higher than 50 mass ppm. Additionally, from the viewpoint of increasing the durability against repeated washing by use of an acid, such as HF, it is more preferable that the outer tube have the entire surface coated with a silicon carbide film by CVD (chemical vapor deposition). In the case of a dual tube with the outer tube and the inner tube 71 being combined, it is preferable that the inner tube is made of silicon carbide having a high purity as in the outer tube. Each of the base 65, the lid 66 and the reactor wall 63 may be appropriately made of a material normally used for formation thereof. There is no particular limitation to the material of each of the base, the lid and the reactor wall. Each of the base 65 and the lid 66 is normally made of stainless steel, and the reactor wall 63 normally comprises a combination of the metal casing 61 made of stainless steel and the thermal insulation material 62 made of silica-alumina.

There is no limitation to the application of the system as long as the system has the structure stated earlier and has a purpose for subjecting semiconductor wafers to thermal treatment. Example of the application are a low pressure CVD system, a reactor for thermal oxidation treatment and an anneal reactor. FIG. 1 shows a case wherein the system 60 according to the present invention is applied to a low pressure CVD system. When being applied to a low pressure CVD system, many semiconductor wafers W are inserted into and supported on a wafer boat 50, the wafer boat is introduced into the dual tube 73, being put on the lid, and the opening of the base 65 is closed by the lid 66.

Next, the inside of the dual tube 73 is depressurized through the gas introduction and discharge port 67, and a reaction gas is introduced through the port to deposit a CVD film on the semiconductor wafers W. When film deposition has been completed, the inside in the dual tube 73 is released from the depressurized state, and the lid 66 is lowered to take out the semiconductor wafers supported on the wafer boat 50. By repeating such operation, it is possible to repeatedly deposit CVD films on the semiconductor wafers W.

Now, examples of the present invention (Examples 1 and Example 2) and a comparative example (Example 3) will be shown.

EXAMPLE 1

A low pressure CVD system, which included an inner tube 71 having an inner diameter of 270 mm, a thickness of 2.5 mm and a height of 1,200 mm and made of silicon carbide containing 5 mass ppm of Fe as an impurity, and an outer tube 72 having an inner diameter of 307 mm, a thickness of 4.5 mm, a height of 1,400 mm, a flange inner diameter of 307 mm, a flange outer diameter of 400 mm and a flange thickness of 10 mm and made of silicon carbide containing 5 mass ppm of Fe as an impurity, and which was formed as shown in FIG. 1, was used.

Between the outer tube 71 and a base 65, an O-ring made of vinylidene fluoride rubber (JIS B2401, Bearing Number V335) was interposed as a sealing member 68. The supporting member interposed between the outer tube and the base outside the O-ring 68 had an outer diameter of 410 mm, an inner diameter of 350 mm and a height of about 4 mm and was formed in a five-layered structure wherein members made of Al and members made of porous PTFE were concentrically provided so as to have substantially equal widths in the order of a member made of PTFE, a member made of Al and a member made of PTFE from the outer periphery as shown in FIG. 3(*b*).

The heater height H was set at 80 mm from the lowest end of the flange of the outer tube. Although the CVD system thus configured was used to repeatedly deposit CVD films made of flat polysilicon (F-Poly) on semiconductor wafers W 40 times at a temperature of 630° C., no defect, such as a crack, was observed in the outer ring 72 and the O-ring 68. The sealing ability was sufficiently maintained, and the degree of vacuum in the dual tube 73 was in a required range. The supporting member 92 had an elastic modulus of 29 GPa and an effective heat transfer coefficient of 550 W/(m$^2$·K).

EXAMPLE 2

In the low pressure CVD system of Example 1, the same configuration was adopted except that the supporting member 92 used in the system was formed so as to have members having a thickness of 3 mm and made of Al and members having a thickness of 1 mm and made of PTFE layered in a height direction as shown in FIG. 3(*a*). Although the low pressure CVD system thus configured was used to repeatedly deposit of CVD films 40 times as in Example 1, no defect, such as a crack, was not observed in the outer ring 72 and the O-ring 68. The sealing ability was sufficiently maintained, and the degree of vacuum in the dual tube 73 was in a required range. Although the low pressure CVD system thus configured was used to repeat deposition of CVD films made of silicon nitride 40 times at a higher temperature of 750° C., no problem occurred. The supporting member 92 had an elastic modulus of 1.9 GPa and an effective heat transfer coefficient of 222 W/(m$^2$·K).

EXAMPLE 3

In the low pressure CVD system of Example 1, the same configuration was used except that the supporting member 92 was not interposed and that only the O-ring 68 was interposed. When the low pressure CVD system thus configured was used to repeat the deposition operation of CVD films stated in Example 1 twice, the deposition operation was stopped since a crack was found in a lower portion of a peripheral wall 72a of the outer tube 72. When the system was disassembled for inspection, it was revealed that the O-ring 68 was partly seized.

In accordance with the system according to the present invention, it is possible to absorb a thermal stress caused in the outer tube during thermal treatment by using a supporting member having a specific effective heat transfer coefficient in combination with the sealing member. Accordingly, it is possible to increase the degree of freedom in designing of the outer tube since the limitation to the shape of the outer tube can be minimized, and it is also possible to easily fabricate the outer tube. The system according to the present invention is characterized in that it is possible to deal with a large volume of silicon wafers at a time since the outer tube can be prevented from being fractured by a thermal stress generated even when the diameter of the outer tube is largely increased or the position of the lowest end of the heater is brought nearer to the lowest end of the outer tube in comparison with a distance of 200 mm in thermal treatment systems for semiconductors. Additionally, it is possible to significantly improve the sealing ability in comparison with a case wherein the outer tube is supported on an inner peripheral portion of the base.

The entire disclosure of Japanese Patent Application No. 2003-90050 filed on Mar. 28, 2003 including specification, claims, drawings and summary is incorporated herein by reference in its entirety.

What is claimed is:

1. A thermal treatment system for semiconductors, comprising:
    an outer tube, comprising silicon carbide, and which has an upper portion closed and a lower portion opened, and has a flange formed on an outer peripheral side of the lower portion;
    a base, which supports the lower portion of the outer tube and provides a hermetic seal between the lower portion of the outer tube and the base;
    a lid, which is provided so as to selectively open and close an opening formed in a central portion of the base; and
    a reactor wall, which surrounds an outer peripheral wall and an upper wall of the outer tube and has a heater provided on an inner side;
    wherein an annular sealing member and an annular supporting member are interposed between the outer tube and the base so that the supporting member is located around an outer peripheral side of the sealing member, and wherein the supporting member has an effective heat transfer coefficient of 50 to 2,000 W/(m$^2$·K), and the supporting member comprises plural members layered in a height direction or a peripheral direction.

2. The thermal treatment system according to claim 1, wherein the supporting member has an effective heat transfer coefficient of 50 to 1,000 W/(m$^2$·K).

3. The thermal treatment system according to claim 1, wherein the supporting member comprises a fluororesin or aluminum.

4. The thermal treatment system according to claim 1, wherein there is included an inner tube, which is provided around an inner peripheral side of the outer tube with a gap, which has upper and lower ends opened, and which comprises silicon carbide.

* * * * *